(12) United States Patent
Hirose et al.

(10) Patent No.: US 6,524,723 B2
(45) Date of Patent: Feb. 25, 2003

(54) COPPER FOIL FOR PRINTED CIRCUIT BOARDS AND ITS SURFACE TREATMENT METHOD

(75) Inventors: Masaru Hirose, Higashino Minami (JP); Masasto Takami, Gokasho (JP)

(73) Assignee: Fukuda Metal Foil & Powder Co., Ltd., Kyoto (JP)

( * ) Notice: Subject to any disclaimer, the term of this patent is extended or adjusted under 35 U.S.C. 154(b) by 0 days.

(21) Appl. No.: 09/833,062

(22) Filed: Apr. 12, 2001

(65) Prior Publication Data

US 2002/0017395 A1 Feb. 14, 2002

(30) Foreign Application Priority Data

Apr. 28, 2000 (JP) .................................... 2000-129172

(51) Int. Cl.⁷ .................... B32B 15/20; B32B 15/08; C25D 11/38; C25D 3/56; H05K 3/38
(52) U.S. Cl. ................. 428/607; 428/658; 428/674; 428/632; 428/626; 428/935; 205/177; 205/244
(58) Field of Search ................ 428/607, 626, 428/658, 674, 675, 632, 935; 174/256; 205/177, 178, 244, 319

(56) References Cited

U.S. PATENT DOCUMENTS

| | | | | |
|---|---|---|---|---|
| 4,376,154 A | * | 3/1983 | Nakatsugawa | ............... 205/125 |
| 4,386,139 A | * | 5/1983 | Nakatsugawa | ............... 204/432 |
| 5,320,919 A | * | 6/1994 | Azuma et al. | ............... 205/125 |
| 5,338,619 A | * | 8/1994 | Fukuda et al. | ............... 428/623 |
| 5,456,817 A | * | 10/1995 | Hino et al. | ............... 205/125 |
| 5,712,047 A | * | 1/1998 | Aso et al. | ............... 428/607 |

FOREIGN PATENT DOCUMENTS

| | | |
|---|---|---|
| JP | 05-140765 | 8/1993 |
| JP | 05-299834 | 12/1993 |
| JP | 7-233497 | * 9/1995 |

* cited by examiner

Primary Examiner—John J. Zimmerman
(74) Attorney, Agent, or Firm—Ronald E. Greigg

(57) ABSTRACT

Disclosed is a copper foil—for printed circuit boards—which is especially excellent in soft etching property and also superior in such properties as heat discoloration resistance, rust-proofing and solder-ability. The copper foil for printed circuit boards comprising a first layer formed by applying 12 to 50 mg/m² of a sulfur-contained zinc alloy containing 0.1 to 2.5 percent by weight of sulfur on the surface on at least one side of the copper foil and a second layer formed of a chromate layer on the first layer by applying 0.5 to 2.5 mg/m² of chromium and, if necessary, 1.5 to 6 mg/m² of phosphorus. The process of treating the surface of copper foil for printed circuit boards comprising the steps of forming the first layer composed of a sulfur-contained zinc alloy by electrolysis by dipping at least the surface on one side of the copper foil in a solution containing a zinc compound and a sulfur compound and forming the second layer composed of chromate by electrolysis by dipping said first layer in a solution containing a chromium compound, or a chromium compound and a phosphorus compound.

3 Claims, No Drawings

COPPER FOIL FOR PRINTED CIRCUIT BOARDS AND ITS SURFACE TREATMENT METHOD

BACKGROUND OF THE INVENTION

1. Field of the Invention

The present invention relates to copper foil for printed circuit boards. More specifically, this invention concerns the copper foil for printed circuit boards—the copper foil having a surface so treated as to be provided with a uniform rough condition and a high adhesion to resins for use in the semiconductor field represented by printed circuit boards.

2. Description of the Prior Art

Printed circuit boards have been used as electronics and electric materials in large quantities and improved in performance and reliability, and the properties required in the printed circuit boards are getting complicated and diversified. The copper foil, one of the constituent materials of the printed circuit board, too, has to meet high quality requirements.

Printed circuit boards are made in the following process. First, the matte side of copper foil is put on or laminated with an insulating resin-impregnated base material, heated and press-bonded into a copper-clad laminate. Then a wiring circuit is formed to obtain a printed circuit board.

The glass-epoxy resin (grade FR-4) which is widely used as resin-impregnated base material is pressed for 1 to 2 hours at about 170° C. into a copper-clad laminate. Some high heat-resistant resins such as glass-polyimide resin requires pressing for two hours at a higher temperature, that is, 220° C.

As copper foil for printed circuit boards, the electro-deposited copper foil with a matte surface on one side and a shiny surface on the other side is predominately used. An untreated electro-deposited copper foil called crude foil is made by depositing copper by electrolysis and then subjecting it to the following surface treatment.

That is, the side of copper foil for printed circuit boards—the side that is bonded to the resin base material—is treated to secure an adequate peel strength this way. In the case of electro-deposited copper foil, the side (non-shiny side) to be bonded to the base material (and in the case of rolled copper foil, either of the sides) is pickled and roughened, and in addition, is given such treatments as to secure heat discoloration resistance, chemical resistance and such treatments as to improve and stablize etching properties. On the other hand, the side not to be bonded to the resin base material requires properties different from those on the other side—heat discoloration resistance and solder-ability.

Therefore, the bonding side and the non-bonding side of copper foil for printed circuit boards require different treatments, and a variety of techniques have been developed and proposed, which have made available copper foils for printed circuit boards with high functional surfaces.

For improvement of dimensional accuracy, furthermore, some copper foils for printed circuit boards are subjected to a long post-curing at a high temperature after pressing, and the needs of copper foils for printed circuit boards requiring heat discoloration resistance are increasing year by year. In addition, flexible printed circuit boards using other than the glass-epoxy resin base material are often subjected to heat treatment for a long time at a high temperature. Now, the heat discoloration resistance is one of the most important properties required on the non-bonding side of the copper foil.

Furthermore, multi-layer printed circuit boards are made in the following procedure. A wiring circuit is formed on the copper foil on a base material like glass-epoxy resin to obtain a primary laminate. On the circuit of this primary laminate, another resin board is laminated into a multi-layer printed circuit board.

The wiring circuit formed on the primary laminate is given a black oxide treatment to improve the adhesion as pretreatment before another resin base material is laminated thereon. In some cases, before a black oxide treated layer is formed, the wiring circuit is soft-etched in order to improve the adhesion between the wiring circuit and the black oxide treated layer.

Or, in some cases, copper foils are soft-etched before the formation of a circuit to increase the adhesion of the etching resist which is used to form a wiring circuit.

As mentioned above, the soft etching step is indispensable in making a printed circuit board. It is required that the treated surface is large in unevenness and has a uniform rough condition.

As soft etching agents, the following chemicals are generally used: sodium peroxodisulfate—sulfuric acid, ammonium peroxodisulfate—sulfuric acid, hydrogen peroxide—sulfuric acid.

A number of different techniques for maintaining the heat discoloration resistance have been proposed.

For example, Japanese publicized examined patent application gazette No. 54-29187 discloses a process involving forming a coat by dipping copper in an alkaline aqueous solution containing zinc or applying current with copper as cathode in the same solution. Japanese publicized examined patent application gazette No. 58-7077 discloses a process of providing a coated layer formed of zinc or zinc oxide and an oxide of chromium. Japanese publicized examined patent application gazette No. 2517503 discloses a process of chromating after forming a Zn—Ni alloy layer. Japanese unexamined patent application gazette No. 5-299834 proposes a copper foil provided with a composite layer containing zinc, chromium and phosphorus.

By any of those soft etching techniques, however, it is impossible to obtain a copper foil surface with much unevenness and a uniform rough condition. The subsequent black oxide treatment, too, fails to provide sufficient adhesion. Thus, no processes that can improve soft etching property enough have been proposed.

In addition, the coated layer of a mixture made of zinc or zinc oxide and an oxide of chromium disclosed in Japanese publicized examined patent application gazette No. 58-7077 is satisfactory in solder-ability but the problem is that the coated layer is so thin that the heat discoloration resistance and rust-prevention are poor. Also, the copper foil surface obtained according to the process of chromating after formation of a Zn—Ni alloy layer disclosed in Japanese patent No. 2517503 has a problem with solder-ability.

SUMMARY OF THE INVENTION

It is accordingly an object of this invention to provide a copper foil for printed circuit boards, especially with excellent soft etching property, heat discoloration resistance, rust-proofing, solder-ability etc. and a process of treating the surface.

The foregoing object is effected by the invention as will be apparent from the following description. That is, a first layer is formed by applying 12 to 50 mg/m$^2$ of a sulfur-contained zinc alloy containing 0.1 to 2.5 percent by weight of sulfur on the surface on at least one side. And then a second layer or a chromate layer is formed on the first layer.

This arrangement provides a copper foil for printed circuit boards excellent especially in soft etching property, heat discoloration resistance, rust-proofing, solder-ability etc.

In other words, the sulfur-contained zinc alloy layer has much to do with soft etching property. The presence of sulfur promotes the roughening effect of the soft etching solution on the surface of copper foil and improves the soft etching property. Furthermore, since the film formed of the sulfur-contained zinc alloy layer alone is poor in rust-prevention and heat discoloration resistance, the chromate layer is formed to improve the rust-prevention and heat discoloration resistance.

The above-mentioned second layer is a chromate layer formed by applying 0.5 to 2.5 mg/m$^2$ of chromium and 1.5 to 6 mg/m$^2$ of phosphorus.

According to this arrangement, the chromate layer is made to contain phosphorus to bring the quantity applied on the copper foil to a specific level, which further improves rust-prevention and heat discoloration resistance.

First, the first layer of the copper foil for printed circuit boards is explained. The first layer is formed by depositing a zinc layer containing sulfur on the shiny side of the copper foil.

It is required that the first layer is almost uniformly stuck on the shiny side of the copper foil with the quantity of the first layer applied in 12 to 50 mg/m$^2$. But even if the layer is not uniform and somewhat varies in thickness, it will have no adverse effect on the advantages of the present invention.

The application of 50 mg/m$^2$ or greater is not desirable, because that would result in poor effectiveness and is bad economy. Furthermore, zinc is low in electric conductivity. That is, the layer would drop in electric conductivity. In addition, the copper foil containing those layers will he outside the purity standards. It is not desirable, either, if the application quantity is 12 mg/m$^2$ or less because the heat discoloration resistance would be poor.

The quantity of sulfur applied is preferably 0.1 to 2.5 percent by weight to zinc. The application of 0.1 percent or less by weight is not desirable, because the heat discoloration resistance would be affected. The application of 2.5 percent or higher by weight is undesirable, either, because the heat discoloration resistance would decrease and also the rust—prevention would fall though no adverse effect would be found on the soft etching property.

A number of different methods of forming the first layer are possible. For working in the industry, cathodic electrolysis (electroplating) is the easiest, and less expensive and suitable.

The cathodic electrolysis is electroplating performed with copper foil as cathode in a solution containing a zinc compound and a sulfur compound.

Among the suitable zinc compounds are zinc sulfate, zinc acetate, zinc citrate and zinc oxide.

As suitable sulfur compounds, the following may be named: thiourea compounds and sulfur-contained organic compounds such as thiourea, arylthiourea, acetylthiourea, aminobenzothiazol, thioacetoamide, imidazolinedinethione, benzimidazolthiol, mercaptothiazoline, cysteine, thiodiethanol, thiodipropionic acid, and also such inorganic compounds as sodium thiosulfate and potassium sulfate.

While no particular restrictions are imposed on the electrolysis bath and electro-deposited conditions, the following conditions are preferable:

| | |
|---|---|
| $ZnSO_4.7H_2O$ | 0.03–0.50 mol/l (8.6–144 g/l) |
| $CH_3COONa.3H_2O$ | 5–50 g/l |
| Sulfur-contained organic compounds | 1–1000 ppm |
| pH | 3.0–5.0 |
| Bath temperature | 20–40° C. |
| Current density | 0.1–3.0 A/dm$^2$ |
| Quantity of electricity | 0.5–2.0 C/dm$^2$ |

The pH value is adjusted with sulfuric acid or sodium hydroxide.

Next, the second layer of the copper foil for printed circuit boards according to the present invention will be explained.

The second layer, which is formed on the first layer, is a chromate layer. If the layer condition is almost uniform, some fluctuation in thickness has no adverse effect on the advantages of the present invention.

The quantity of chromium applied is preferably 0.5 to 2.5 mg/m$^2$.

It is also noted that the addition of phosphorus to the chromate layer could further improve the heat discoloration resistance and rust-prevention, and therefore, the application of phosphorus compounds is more preferably 1.5 to 6 mg/m$^2$.

If the quantities of both chromium and phosphorus applied are less than the application ranges indicated above, there will be a fall in rust-prevention and heat discoloration resistance. If, on the other hand, those quantities are higher than the ranges, then the solder-ability will deteriorate.

For formation of the second layer, the easiest, less expensive and most is electrolysis (cathodic electrolysis) with copper foil as cathode in a solution containing a chromium compound or a chromium and a phosphorus compound.

In this method, it is preferable that the current density is 0.1 to 3 A/dm$^2$ and the electrolysis time is 1 to 10 seconds.

Among the suitable chromium compounds are hexahydric chromium compounds such as sodium dichromate, potassium dichromate, chromate trioxide. The chromium compounds are applied in a solution of 0.2 to 10 g/l.

The suitable phosphorus compounds include trisodium phosphate, disodium hydrogenphosphate, sodium dihydrogenphosphate, tripotassium phosphate, dipotassium hydrogenphosphate, potassium dihydrogenphosphate, lithium phosphate, sodium pyrophosphate, potassium pyrophosphate, sodium tripolyphosphate, phosphorus and sodium hypophosphate. These phosphorus compounds are applied in a solution of 1 to 20 g/l.

The pH of the treatment bath for formation of the second layer is preferably 4 to 12. The pH higher or lower that range is not desirable, because zinc in the first layer dissolves.

The treatments of the shiny side has just been described. Now, the treatments of the matte side will be explained briefly.

The roughening to improve the peel strength to the resin base material is carried out in a procedure as disclosed in Japanese publicized examined patent application gazette No. 50-40109. Or copper dendrites are deposited on the copper of the copper foil and fixed by copper plating to form a copper matte surface. Then, a barrier layer as disclosed in Japanese publicized examined patent application gazette No. 2-24037 is formed, followed by rust-proofing treatment before the process is completed.

Also, a first layer and a second layer according to the present invention may be formed by depositing copper particles on the shiny side of copper foil in a roughening treatment, followed by barrier treatment, chromate treatment and rust-proofing by known methods.

To further improve rust-prevention and other properties, the copper foil for printed circuit boards according to the present invention may be treated with such azoles as benzotriazole, tolytriazole, imidazole and benzimidazole, and silane coupling agent etc.

The first layer according to the present invention has much to do with the soft etching property. The presence of sulfur promotes the roughening effect of the soft etching solution on the copper foil surface and improves the soft etching property.

The second layer is a chromate layer formed of chromium or chromium, phosphorus to enhance, because a layer containing sulfur alone is poor in the rust-prevention and heat discoloration resistance.

DESCRIPTION OF THE PREFERRED EMBODIMENTS

Now, the embodiments of the present invention will be described.

Embodiment 1

The matte side of an electro-deposited copper foil 35 μm thick was roughened in a known method and the shiny side was subjected to cathodic electrolysis for 3 seconds at a current density of 0.4 A/dm² in Bath (A) prepared of

| | |
|---|---|
| $ZnSO_4.7H_2O$ | 25 g/l |
| $CH_3COONa.3H_2O$ | 10 g/l |
| Imidazolidinethione | 1 g/l |
| at pH | 4.0 |
| at temperature | 30° C. | rinsed and was subjected to cathodic electrolysis for 3 seconds at a current density of 0.6 A/dm² in Bath (B) prepared of:

| | |
|---|---|
| $Na_2Cr_2O_7.2H_2O$ | 5 g/l |
| $K_2HPO_4$ | 10 g/l |
| at pH | 8.0 |
| at temperature | 30° C. | followed by rinsing and drying.

The heat discoloration resistance, solder-ability and rust-prevention of the shiny side of the copper foil were examined, and the results are given in Table 1.

In addition, this copper foil was placed on a base material impregnated with a glass-epoxy resin grade FR-4 and pressed under a pressure of 3.9 Mpa at 170° C. for 60 minutes.

The soft etching property of the shiny side of this copper-clad laminate was determined, and the results are given in Table 1.

The methods of determination of the soft etching property, heat discoloration resistance, solder-ability, rust-prevention and other properties will be described later.

Embodiment 2

A copper foil was treated in the same way as in Embodiment 1 except that after the matte side of an electro-deposited copper foil 35 μm thick was roughened in a known method, the shiny side of the electro-deposited copper foil was subjected to cathodic electrolysis for 3 seconds at a current density of 0.7 A/dm² in bath (A) in Embodiment 1.

The properties of the copper foil were examined in the same way as Embodiment 1. The results are given in Table 1.

Embodiment 3

A copper foil was treated in the same way as in Embodiment 1 except that after the matte side of an electro-deposited copper foil 35 μm thick was roughened in a known method, the shiny side of the electro-deposited copper foil was subjected to cathodic electrolysis for 2 seconds at a current density of 0.4 A/dm² in bath (A) in Embodiment 1.

The properties of the copper foil were examined in the same way as Embodiment 1. The results are given in Table 1.

Embodiment 4

The matte side of an electro-deposited copper foil 35 μm thick was roughened in a known process and the shiny side was subjected to cathodic electrolysis for 3 seconds at a current density of 0.4 A/dm² in Bath (C) prepared of

| | |
|---|---|
| $ZnSO_4.7H_2O$ | 25 g/l |
| $CH_3COONa.3H_2O$ | 10 g/l |

| Thiourea | 1 mg/l |
| at pH | 4.0 |
| at temperature | 30° C. | rinsed and was subjected to cathodic electrolysis for 3 seconds at a current density of 0.6 A/dm² in bath (B) in Embodiment 1, followed by rinsing and drying.

The properties of the shiny side of the copper foil were examined in the same way as Embodiment 1. The results are given in Table 1.

Embodiment 5

The matte side of an electro-deposited copper foil 35 μm thick was roughened in a known process and the shiny side was subjected to cathodic electrolysis for 3 seconds at a current density of 0.4 A/dm² in Bath (D) prepared of

| ZnO | 7 g/l |
| NaOH | 50 g/l |
| Sodium thiosulfate | 0.3 g/l |
| at temperature | 30° C. | rinsed and was subjected to cathodic electrolysis for 3 seconds at a current density of 0.6 A/dm² in Bath (E) prepared of:

| Na₂Cr₂O₇.2H₂O | 8 g/l |
| Na₃PO₄.H₂O | 15 g/l |
| at pH | 9.0 |
| at temperature | 30° C. | followed by rinsing and drying.

The properties of the shiny side of the copper foil were examined in the same way as Embodiment 1. The results are given in Table 1.

Embodiment 6

A copper foil was treated in the same way as in Embodiment 5, that is, after the matte side of an electro-deposited copper foil 35 μm thick was roughened in a known method, the shiny side of the electro-deposited copper foil was subjected to cathodic electrolysis bath except that the concentration of sodium thiosulfate was 1 g/l.

The properties of the shiny side of the copper foil were examined in the same way as Embodiment 1. The results are given in Table 1.

Embodiment 7

The matte side of an electro-deposited copper foil 35 μm thick was roughened in a known process and the shiny side was subjected to cathodic electrolysis for 3 seconds at a current density of 0.4 A/dm² in Bath (F) prepared of

| ZnO | 7 g/l |
| NaOH | 50 g/l |
| benzimidazoletiol | 0.1 g/l |
| at temperature | 30° C. | rinsed and was subjected to cathodic electrolysis for 3 seconds at a current density of 0.6 A/dm² in the same bath as Bath (E) in Embodiment (5), and then rinsed and dried.

The properties of the shiny side of the copper foil were examined in the same way as Embodiment 1. The results are given in Table 1.

Embodiment 8

The matte side of an electro-deposited copper foil 35 μm thick was roughened in a known process and the shiny side was subjected to cathodic electrolysis for 4 seconds at a current density of 0.4 A/dm² in Bath (G) prepared of

| ZnO | 7 g/l |
| NaOH | 50 g/l |
| Thiourea | 3 mg/l |
| at temperature | 30° C. | rinsed and was subjected to cathodic electrolysis for 3 seconds at a current density of 0.6 A/dm² in the same bath as Bath (E) in Embodiment 5, then rinsed and dried.

The properties of the shiny side of the copper foil were examined in the same way as Embodiment 1. The results are given in Table 1.

Embodiment 9

The matte side of an electro-deposited copper foil 35 μm thick was roughened in a known process and the shiny side was subjected to cathodic electrolysis for 4 seconds at a current density of 0.4 A/dm² in (H) Bath prepared of

| ZnO | 7 g/l |
| NaOH | 50 g/l |
| Potassium sulfide | 30 mg/l |
| at temperature | 30° C. | rinsed and was subjected to cathodic electrolysis for 3 seconds at a current density of 0.6 A/dm² in the same bath as Bath (E) in Embodiment 5, then rinsed and dried.

The properties of the shiny side of the copper foil were examined in the same way as Embodiment 1. The results are given in Table 1.

Embodiment 10

The matte side of an electrodeposited copper foil 35 μm thick was roughened in a known process and the shiny side was subjected to cathodic electrolysis for 3 seconds at a current density of 0.3 A/dm² in the same bath as Bath (D) in Embodiment 5 and rinsed, and then subjected to cathodic electrolysis for 3 seconds at a current density of 1.0A/dm² in the same bath as Bath (E) in Embodiment 5, then rinsed and dried.

The properties of the shiny side of the copper foil were examined in the same way as Embodiment 1. The results are given in Table 1.

Embodiment 11

The matte side of an electrodeposited copper foil 35 μm thick was roughened in a known process and the shiny side was subjected to cathodic electrolysis for 4 seconds at a current density of 0.5 A/dm² in the same bath as Bath (H) in Embodiment 9 except that the concentration of potassium sulfate was 70 mg/l and rinsed, and then subjected to cathodic electrolysis for 3 seconds at a current density of 1.0 A/dm² in the same bath as Bath (E) in Embodiment 5, then rinsed and dried.

The properties of the shiny side of the copper foil were examined in the same way as Embodiment 1. The results are given in Table 1.

COMPARATIVE EXAMPLES

Comparative Example 1

The shiny side of a copper 35 μm thick with the matte side roughened in a known process was subjected to cathodic electrolysis for 3 seconds at a current density of 0.4 A/dm² in Bath (I) prepared of

| ZnO | 7 g/l |
|---|---|
| NaOH | 50 g/l |
| at temperature | 30° C. | rinsed and was subjected to cathodic electrolysis for 3 seconds at a current density of 0.6 A/dm² in Bath (J) prepared of

| $Na_2Cr_2O_7.2H_2O$ | 5 g/l |
|---|---|
| at pH | 8.0 |
| at temperature | 30° C. | followed by rinsing and drying.

The properties of the shiny side of the electro-deposited copper foil were examined in the same way as Embodiment 1. The results are given in Table 1.

Comparative Example 2

The shiny side of a copper 35 μm thick with the matte side roughened in a known process was subjected to cathodic electrolysis for 5 seconds at a current density of 2.0 A/dm² in Bath (K) prepared of

| $ZnSO_4.7H_2O$ | 25 g/l |
|---|---|
| $Na_2Cr_2O_7.2H_2O$ | 20 g/l |
| NaOH | 50 g/l |
| at temperature | 30° C. | rinsed and was subjected to cathodic electrolysis for 5 seconds at a current density of 2.0 A/dm², followed by rinsing and drying.

The properties of the shiny side of the copper foil were examined in the same way as Embodiment 1. The results are given in Table 1.

Comparative Example 3

The shiny side of a copper 35 μm thick with the matte side roughened in a known process was subjected to cathodic electrolysis for 3 seconds at a current density of 1.0 A/dm² in (L) Bath prepared of

| $ZnSO_4.7H_2O$ | 2.5 g/l |
|---|---|
| $Na_2Cr_2O_7.2H_2O$ | 5 g/l |
| $Na_3PO_4.12H_2O$ | 3 g/l |
| NaOH | 30 g/l |
| at temperature | 30° C. | rinsed and dried.

The properties of the shiny side of the electro-deposited copper foil were examined in the same way as Embodiment 1. The results are given in Table 1.

Comparative Example 4

The shiny side of a copper 35 μm thick with the matte side roughened in a known process was subjected to cathodic electrolysis for 3 seconds at a current density of 0.4 A/dm² in Bath (M) prepared of

| $ZnSO_4.7H_2O$ | 40 g/l |
|---|---|
| $NiSO_4.6H_2O$ | 30 g/l |
| $CH_3COONa \cdot 3H_2O$ | 20 g/l |
| pH | 4.0 |
| at temperature | 30° C. | rinsed and was subjected to cathodic electrolysis for 3 seconds at 0.2 A/dm² in

Bath (N) prepared of

| $Na_2Cr_2O_7.2H_2O$ | 3 g/l |
|---|---|
| at pH | 12 |
| at temperature | 30° C. |
| rinsed and dried. | |

The properties of the shiny side of the copper foil were examined in the same way as Embodiment 1. The results are given in Table 1.

Of the elements applied, Ni was applied in 2 mg/m².

TABLE 1

| | Visual inspection | Gloss | Heat discoloration resistance E-1/240 | Rust-prevent C-72/60/85 | Solder-ability | Quantity applied Zn | S | S* (%) | Cr | P |
|---|---|---|---|---|---|---|---|---|---|---|
| Embodiments | | | | | | | | | | |
| (1) | O | 28 | O | O | O | 25 | 0.15 | 0.6 | 0.9 | 2.7 |
| (2) | O | 26 | O | O | O | 46 | 0.25 | 0.5 | 1.1 | 3.0 |
| (3) | O | 32 | □ | □ | O | 16 | 0.16 | 1.0 | 1.0 | 1.9 |
| (4) | O | 29 | O | O | O | 30 | 0.06 | 0.2 | 1.0 | 3.4 |
| (5) | O | 23 | O | O | O | 23 | 0.37 | 1.6 | 1.7 | 3.7 |
| (6) | O | 21 | O | O | O | 29 | 0.40 | 1.4 | 1.5 | 4.9 |
| (7) | O | 34 | O | O | O | 26 | 0.22 | 0.8 | 1.6 | 5.3 |
| (8) | O | 23 | O | O | O | 34 | 0.16 | 0.5 | 1.5 | 4.3 |
| (9) | O | 26 | O | O | O | 34 | 0.13 | 0.4 | 1.8 | 4.6 |
| (10) | O | 27 | □ | □ | O | 21 | 0.45 | 2.2 | 1.5 | 3.2 |
| (11) | O | 32 | O | □ | O | 50 | 0.52 | 1.0 | 2.3 | 3.7 |
| Comparative example | | | | | | | | | | |
| (1) | X | 52 | O | Δ | O | 28 | — | — | 1.0 | — |
| (2) | X | 60 | XX | X | O | 10 | — | — | 1.2 | — |
| (3) | X | 58 | XX | Δ | O | 4 | — | — | 1.6 | 1.0 |
| (4) | X | 55 | O | O | X | 28 | — | — | 2.0 | — |

* indicates the content (%) in zinc.
(–) indicates that no determination was made.

"Soft etching property" was evaluated by dipping a treated copper foil in a solution containing 220 g/l of sodium peroxodisulfate and 6 g/l of sulfuric acid for 30 seconds at 40° C. with stirring. Then, the copper foil was rinsed and dried and the appearance on the surface was examined and evaluated.

The results are indicated by the following symbols:

O: well roughened with no gloss after soft etching observed

X: Not well roughened with some shiny appearance remaining.

The gloss was determined by a glossmeter (with light receiving angle 60°). The lower the measured value is, the lower the degree of gloss and the better the surface is roughened. A value The gloss was determined by a gloss-meter (with light receiving angle 60°) . The lower the measured value is, the lower the degree of gloss and the better the surface is roughened. A value less than about 40 indicates a good roughened condition.

In other methods than that of the present invention, the degree of gloss is 50 to 60, while the results according to the present invention are 20 to 35. This much difference shows how advantageous the present invention is.

"Heat discoloration resistance" was evaluated by placing the treated copper foil in a hot air circulating-type oven for heat treatment for one hour at 240° C. The gloss side was checked for the degree of change in color. The results are indicated by the following symbols:

O: no change in color observed

□: slight change in color observed (O, □results present no problem in practice.)

Δ: some change in color observed

X: change in color observed all over the surface

XX: Much change in color observed all over the surface

"The solderability" was evaluated on the basis of IPC-MF-150F, 4.5.12 in the following procedure. A treated copper foil was pretreated and dipped in 0.1 mol/l of hydrochloric acid of for 10 seconds at 25° C., rinsed, dried and coated with WWG rosin flux. Then, the copper foil was dipped in a solder bath at 235° C. And the degree of solder-ability was visually evaluated. The results are indicated by the following symbols.

O: completely wetted with solder

X: not so much wetted with solder

"Rust-prevention" was evaluated in the following way. The treated copper foil was held in a constant-temperature, constant- humidity container maintained at 85% relative humidity at 60° C. for 72 hours. After that, the degree of oxidation color change was visually evaluated. The results are indicated by the following symbols.

Q: almost not oxidized

□: slightly oxidized (O, □results are no problem in practice.)

Δ: oxidized to some extent

X: oxidized all over the surface

The copper foil obtained according to the present invention is excellent in soft etching; the roughening unevenness is large and uniform. In addition, even after heat treatment for one hour at 240° C., there will be no change in color and the solder-ability will remain affected. The copper foil according to the present invention has also excellent rust-prevention.

The present invention provides a copper foil—for printed circuit boards—which is especially excellent in soft etching property and also has excellent surface properties such as heat discoloration resistance, rust-proofing, solder-ability and other properties. That is expected to contribute greatly to improvement in reliability of printed circuit boards.

Furthermore, the inventive surface treatment process can be applied to printed circuit board production facilities without difficulty and permits mass production.

What is claimed is:

1. A copper foil for printed circuit boards, said foil comprising:

a first layer formed by applying 12 to 50 mg/m$^2$ of a sulfur containing zinc alloy containing 0.1 to 2.5 percent by weight of sulfur on the surface on at least one side of the copper foil and a second layer formed of a chromate layer on said first layer.

2. The copper foil for printed circuit boards as defined in claim 1, wherein said second layer is a chromate layer formed by applying 0.5 to 2.5 mg/m$^2$ of chromium and 1.5 to 6 mg/m$^2$ of phosphorus.

3. A process of treating the surface of copper foil for printed circuit boards, the process comprising the steps of:

forming the first layer composed of a sulfur containing zinc alloy by electrolysis by dipping at least the surface on one side of the copper foil in a solution containing a zinc compound and a sulfur compound, and forming the second layer composed of chromate by electrolysis by dipping said first layer in a solution containing a chromium compound, or a chromium compound and a phosphorus compound.

* * * * *